(12) United States Patent
Henri et al.

(10) Patent No.: US 8,100,081 B1
(45) Date of Patent: Jan. 24, 2012

(54) EDGE REMOVAL OF FILMS USING EXTERNALLY GENERATED PLASMA SPECIES

(75) Inventors: Jon Henri, West Linn, OR (US);
Henner Meinhold, Fremont, CA (US);
Christopher Gage, Campbell, CA (US);
Dan Doble, Tigard, OR (US)

(73) Assignee: Novellus Systems, Inc., San Jose, CA (US)

( * ) Notice: Subject to any disclaimer, the term of this patent is extended or adjusted under 35 U.S.C. 154(b) by 621 days.

(21) Appl. No.: 11/515,346

(22) Filed: Aug. 31, 2006

Related U.S. Application Data

(63) Continuation-in-part of application No. 11/479,353, filed on Jun. 30, 2006, now abandoned.

(51) Int. Cl.
*C23C 16/452* (2006.01)
*C23C 16/455* (2006.01)
*C23F 1/00* (2006.01)
*H01L 21/306* (2006.01)
*C23C 16/06* (2006.01)
*C23C 16/22* (2006.01)

(52) U.S. Cl. ............ 118/723 R; 118/728; 118/723 ME; 118/723 ER; 118/723 IR; 156/345.33; 156/345.34; 156/345.35

(58) Field of Classification Search ............ 118/723 R, 118/728, 723 ME, 723 ER, 723 IR; 156/345.33, 156/345.34, 345.35
See application file for complete search history.

(56) References Cited

U.S. PATENT DOCUMENTS

| | | |
|---|---|---|
| 4,313,266 A | 2/1982 | Tam |
| 4,788,994 A | 12/1988 | Shinbara |
| 4,968,375 A | 11/1990 | Sato et al. |
| 5,009,738 A | 4/1991 | Gruenwald et al. |
| 5,486,234 A | 1/1996 | Contolini et al. |
| 5,532,190 A * | 7/1996 | Goodyear et al. ............ 438/710 |
| 5,674,410 A | 10/1997 | Nakajima et al. |
| 5,798,016 A * | 8/1998 | Oehrlein et al. ......... 156/345.37 |
| 5,810,940 A | 9/1998 | Fukazawa et al. |
| 5,882,433 A | 3/1999 | Ueno |
| 5,897,379 A | 4/1999 | Ulrich et al. |

(Continued)

FOREIGN PATENT DOCUMENTS
DE  4109955  10/1992
(Continued)

OTHER PUBLICATIONS

U.S. Appl. No. 11/737,045, Stephens et al., "Wafer chuck with aerodynamic design for turbulence reduction", filed Apr. 18, 2007.

(Continued)

*Primary Examiner* — Rudy Zervigon
(74) *Attorney, Agent, or Firm* — Weaver Austin Villeneuve & Sampson LLP

(57) ABSTRACT

The present invention provides methods and apparatuses for removing unwanted film from the edge area of substrate using remotely-generated plasmas. Activated plasma species are directed to the edge of the substrate to contact and remove the unwanted film, while intrusion of the activated species to areas above the active circuit region (where the film is desired) is suppressed. In certain embodiments, intrusion of the activated species is suppressed by the use of a purge gas and/or the use of materials that promote recombination of plasma species. In particular embodiments, atomic oxygen is used to remove ashable films from the edge of semiconductor wafers.

17 Claims, 8 Drawing Sheets

U.S. PATENT DOCUMENTS

| | | | |
|---|---|---|---|
| 6,046,097 | A | 4/2000 | Hsieh et al. |
| 6,050,506 | A * | 4/2000 | Guo et al. ............... 239/558 |
| 6,114,254 | A | 9/2000 | Rolfson |
| 6,162,739 | A | 12/2000 | Sumnitsch et al. |
| 6,167,893 | B1 | 1/2001 | Taatjes et al. |
| 6,217,034 | B1 | 4/2001 | Smedt et al. |
| 6,297,155 | B1 | 10/2001 | Simpson et al. |
| 6,306,245 | B1 | 10/2001 | Yanagisawa et al. |
| 6,309,981 | B1 | 10/2001 | Mayer et al. |
| 6,333,275 | B1 | 12/2001 | Mayer et al. |
| 6,413,436 | B1 | 7/2002 | Aegerter et al. |
| 6,506,689 | B2 | 1/2003 | Rolfson |
| 6,516,815 | B1 | 2/2003 | Stevens et al. |
| 6,520,839 | B1 | 2/2003 | Gonzalez-Martin et al. |
| 6,537,416 | B1 | 3/2003 | Mayer et al. |
| 6,578,853 | B1 | 6/2003 | Treur et al. |
| 6,586,342 | B1 | 7/2003 | Mayer et al. |
| 6,589,878 | B1 | 7/2003 | Lorimer |
| 6,967,174 | B1 | 11/2005 | Mayer et al. |
| 7,029,567 | B2 | 4/2006 | Basol |
| 2002/0179247 | A1 | 12/2002 | Davis et al. |
| 2010/0055924 | A1 | 3/2010 | Ganesan et al. |
| 2010/0219920 | A1 | 9/2010 | Feng et al. |

FOREIGN PATENT DOCUMENTS

| | | |
|---|---|---|
| JP | 04-135110 | 5/1992 |
| JP | 04-186626 | 7/1992 |
| JP | 05-013322 | 1/1993 |
| JP | 05-326483 | 12/1993 |
| JP | 06-045302 | 2/1994 |
| JP | 09-171989 | 6/1997 |
| WO | 99-46064 | 9/1999 |

OTHER PUBLICATIONS

U.S. Appl. No. 12/199,412, Ganesan et al., "Apparatus and method for edge bevel removal of copper from silicon wafers", filed Aug. 27, 2008.

U.S. Appl. No. 12/394,339, Feng et al., "Magnetically actuated chuck for edge bevel removal", filed Feb. 27, 2009.

U.S. Appl. No. 11/248,874, Office Action mailed Aug. 23, 2007.

U.S. Appl. No. 11/248,874, Office Action mailed Nov. 28, 2007.

U.S. Appl. No. 11/248,874, Office Action mailed Jun. 4, 2008.

U.S. Appl. No. 11/479,353, Office Action mailed Dec. 2, 2008.

Glen Research Center, "Shape Effects on Drag", National Aeronautics and Space Administration website http://www.grc.nasa.gov/WWW/K/airplane/shaped.html downloaded Apr. 18, 2007.

U.S. Office Action mailed Mar. 30, 2001, from U.S. Appl. No. 09/557,668.

U.S. Office Action mailed Jun. 19, 2002, from U.S. Appl. No. 09/558,249.

U.S. Office Action mailed Dec. 16, 2004, from U.S. Appl. No. 10/357,999.

U.S. Office Action mailed Jul. 6, 2006, from U.S. Appl. No. 11/248,874.

Mayer et al., "Edge Bevel Removal of Copper From Silicon Wafers," Novellus Systems, Inc., U.S. Appl. No. 11/248,874, filed Oct. 11, 2005, pp. 1-62.

U.S. Office Action mailed Aug. 27, 2001, from U.S. Appl. No. 09/557,695.

Mountsier et al., "Methods for Removing Deposits from the Edge of a Silicon Substrate Using a Plasma Discharge," Novellus Systems, Inc., U.S. Appl. No. 11/479,353, filed Jun. 30, 2006, pp. 1-36.

U.S. Appl. No. 11/479,353, Office Action mailed Jun. 1, 2009.

U.S. Appl. No. 11/479,353, Office Action mailed Dec. 7, 2009.

U.S. Appl. No. 11/248,874, Office Action mailed Nov. 30, 2009.

Wolf, Stanley et al., "Silicon Processing for the VLSI Era, vol. 1: Process Technology", Lattice Press 91986, pp. 516-520.

U.S. Appl. No. 12/701,387, "Methods for removing deposits from the edge of a silicon substrate using a plasma discharge", Mountsier et al., filed Feb. 5, 2010.

U.S. Appl. No. 11/737,045, Office Action mailed Dec. 9, 2010.

Bird, R. Bryan et al., "Chapter 6: Interphase transport isothermal systems", John Wiley and Sons, 1960, pp. 180-1993.

* cited by examiner

EDGE REMOVAL OF FILMS USING EXTERNALLY GENERATED PLASMA SPECIES

CROSS-REFERENCE TO RELATED APPLICATION

This application is a continuation-in-part of and claims priority to U.S. patent application Ser. No. 11/479,353, titled "METHODS FOR REMOVING DEPOSITS FROM THE EDGE OF A SILICON SUBSTRATE USING A PLASMA DISCHARGE," filed Jun. 30, 2006 now abandoned, which hereby incorporated by reference.

FIELD OF THE INVENTION

This invention relates to technology for removing unwanted film from semiconductor wafers. More particularly, it pertains to methods for removing unwanted film, particularly film in the edge regions, using a plasma discharge.

BACKGROUND OF THE INVENTION

During integrated circuit fabrication, various films are needed on the active circuit region of the wafer, i.e., the main interior region on the front side, but are undesirable elsewhere. Deposition processes, including chemical vapor deposition (CVD) and physical vapor deposition (PVD) processes, often deposit films out to the edge of the front side of the silicon substrate or wafer, generally beyond the printed or active area. In many cases, deposition of the films beyond the active circuit region creates difficulties in process integration. For example, drying and baking photoresist leaves a thick berm of material at the edge of the wafer, which can peel and flake during subsequent processing or handling. Other films susceptible to problematic delamination include tungsten, copper seed and organosilicate glass (OSG) films.

Methods of preventing deposition on unwanted areas or removing unwanted films have included using edge exclusion hardware (e.g., a shadow ring) and wet chemical etches using an acid spray directed at the edge. However, edge exclusion hardware may not be compatible with certain deposition systems, e.g. certain plasma deposition systems, and even in compatible systems, may cause problems with deposition uniformity. Wet etching may not be desirable in certain applications as it involves handling of wet solvents. Further, films such as silicon carbide and organosilicon glass (OSG) do not etch appreciably in known wet solvents.

Accordingly, it would be desirable to be able to have new methods of selectively removing unwanted film from the edge of substrates and/or selectively forming films on the active circuit regions of a substrates.

SUMMARY OF THE INVENTION

The present invention meets these needs by providing methods and apparatuses for removing unwanted film from the edge area of substrate using plasmas. In certain embodiments, the plasma is remotely generated. Activated plasma species are directed to the edge of the substrate to contact and remove the unwanted film, while intrusion of the activated species to areas above the active circuit region (where the film is desired) is suppressed. Intrusion of the activated species may be suppressed by the use of a purge gas and/or the use of materials that promote recombination of plasma species. In particular embodiments, atomic oxygen is used to remove ashable films from the edge of semiconductor wafers.

One aspect of the invention relates to a method of removing unwanted film deposited on an edge area of a semiconductor wafer. According to various embodiments, the method involves: (a) providing the semiconductor wafer to a chamber; (b) generating a plasma in a remote plasma generator; and (c) contacting the edge of the wafer to the plasma such that unwanted film is selectively removed from one or more edge regions of the wafer.

Another aspect of the invention relates to a method of removing unwanted film deposited on an edge region of a substrate using a remote plasma generator. According to various embodiments, the method involves providing a substrate having film deposited on an active circuit region and an edge region to a chamber; generating activated plasma species in a remote plasma generator; and selectively removing film from the edge region of the substrate by i) directing the plasma species to the edge region of the substrate, ii) contacting the plasma species to the edge region; and iii) suppressing intrusion of the plasma species to the area above the active circuit region.

Another aspect of the invention relates to apparatuses for removing unwanted film from the edge of a substrate while leaving film in an interior region of the substrate substantially intact. According to various embodiments, the apparatus includes a substrate support and a showerhead apparatus for directing the plasma species to the edge of the substrate and a purge gas to the interior region. The showerhead apparatus includes (i) an inner channel for directing a purge gas onto the interior region of the substrate; (ii) an outer channel for directing plasma species to the edge of the substrate; and (iii) a barrier extending over at least some of the substrate support. In certain embodiments, the apparatus additionally includes (iv) an angled deflector for deflecting activated species toward the edge of the substrate.

These and other aspects and advantages of the invention are described further below and with reference to the drawings.

DETAILED DESCRIPTION OF THE INVENTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

Figure 1:
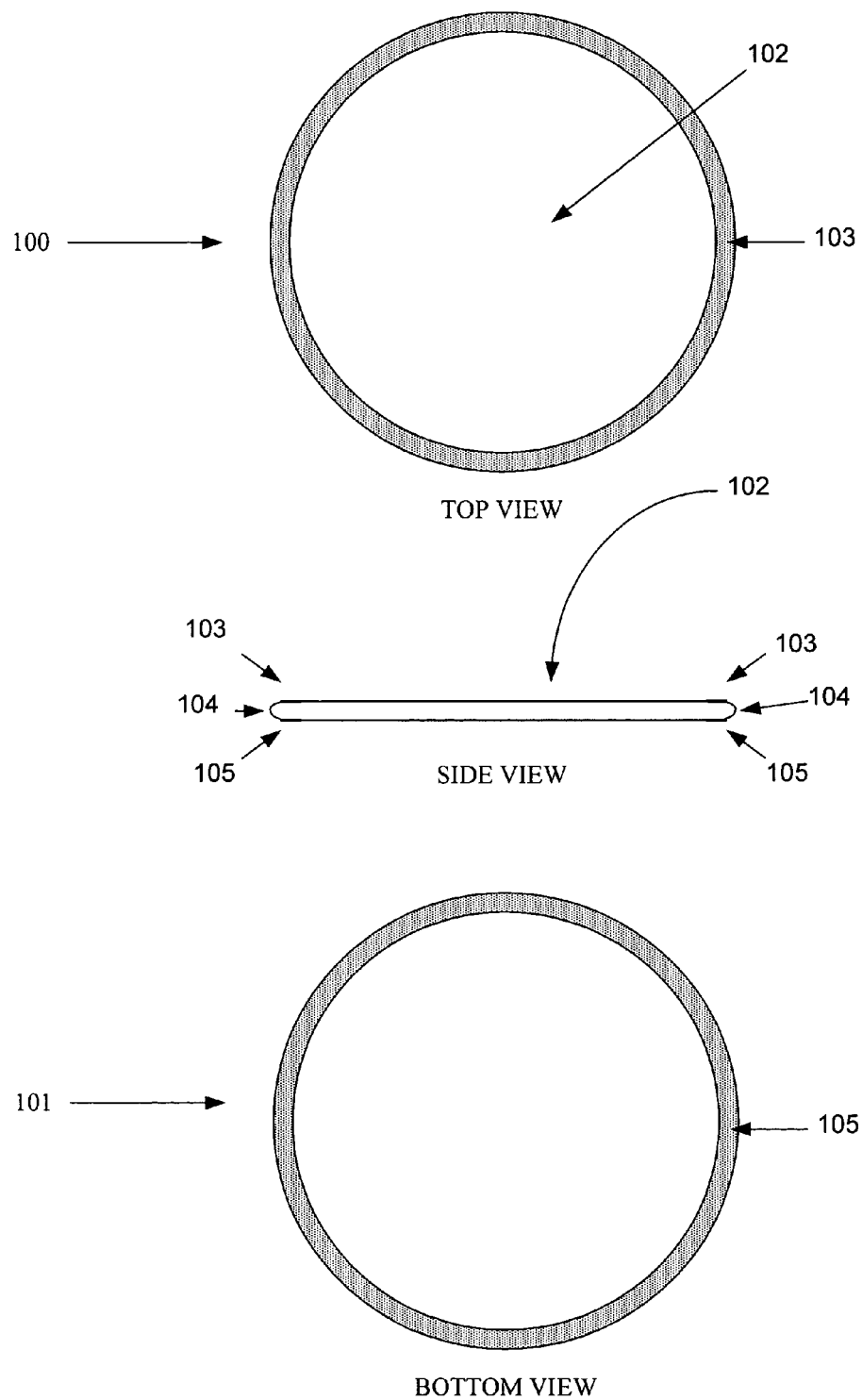
FIG. 1 is an illustration of a semiconductor wafer showing the location of the edge regions that are etched in accordance with certain embodiments of the invention.

A schematic illustration of a semiconductor wafer is shown in FIG. 1. As shown, such semiconductor wafer has a top or "front" side 100 and a "backside" 101. The wafer also has an interior "active circuit region" 102 where integrated circuit devices with associated conductive metal routes are formed. To make maximum use of expensive semiconductor material, this active circuit region should constitute a high fraction of the area on the front side 100 of the wafer. For example, with a 300 mm wafer, the interior active surface region may extend to at least 3 mm of the outer boundary of the wafer.

As shown, integrated circuit wafers also include a "front edge" area 103, which is the region on the front of the wafer that lies outside the active circuit region, a "side edge" area 104 and a "back edge" area 105. The side edge lies in the area between the front side and the backside, and the back edge is roughly the area near the outer boundary of the wafer on its backside, approximately analogous to the front edge area. Unwanted film may deposit on regions 103, 104, and 105. Some material may also deposit over some or all of the entire backside 101. One use of the present invention is to remove unwanted material from one or more of these regions without substantially affecting material deposited on active region 102.

As indicated above, wet chemical etching may be used to remove some deposited films, for example, organic solvents may be used to remove photoresist from wafer edges. Similarly, in physical vapor deposition (PVD) deposited copper may be removed by acid wet etching. Wet etching apparatus and methods for removal of copper from edge regions is described in U.S. Pat. Nos. 6,309,981, 6,586,342, 6,537,416 and 6,333,275, which are hereby incorporated by reference.

However, in some applications wet etching is not appropriate, for example, for films for which there is no commonly used wet solvent. Silicon-containing films, including organosilicate glass films, silicon carbide and silicon nitride, are not removable by common wet chemistries. In addition, in certain applications, it may be undesirable to work with wet chemicals.

The methods of the present invention involve selective removal of unwanted film from outside the active circuit region (i.e., the edge region(s) and/or backside) of a substrate via a plasma etch. Unwanted film is removed from these regions, while leaving film in the center of the wafer substantially intact, thereby allowing successful integration. As indicated, methods of the invention may be used to remove film for which wet etches are not practical. The methods of the invention are not limited to such films, however, but may be used to selectively removed any film that may be removed by a plasma etch, including silicon-containing films, metallic films, photoresist, and organic films such as ashable hard masks. In certain embodiments, the methods may be used to remove film previously deposited using a plasma, e.g. by plasma enhanced chemical vapor deposition.

The methods of the invention selectively remove unwanted film from the edge regions of a substrate by directing activated species to those areas while preventing or suppressing the plasma from contacting the active circuit region. Selective removal refers to removing the film from one or more of the edge regions described above while leaving the film in the active circuit region of the wafer substantially intact. According to various embodiments, the methods involve using generating a plasma in a remote plasma generator and then directing the activated plasma species to the edge area of the wafer or other substrate. The activated species react with the unwanted film to remove it.

The methods of the invention eliminate the need for shadow ring hardware for deposition. This also removes wafer uniformity be eliminating shadow ring interference with film deposition. Particles from film flaking from the edge of substrates are also eliminated or reduced resulting in fewer defects.

Figure 2:
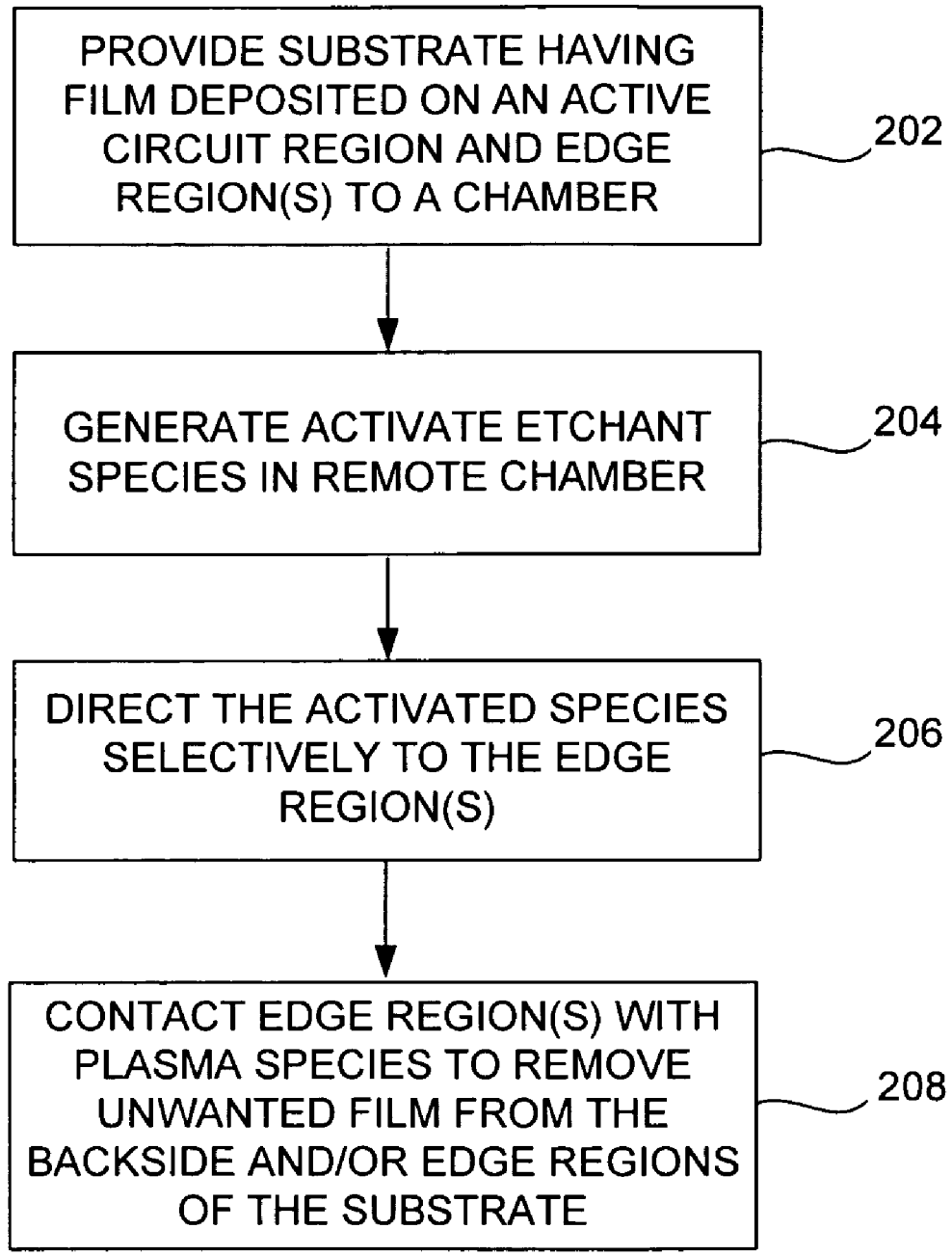
FIG. 2 depicts important stages in a general process flow for a method of selectively removing a film from edge region(s) of a substrate in accordance with certain embodiments of the present invention.

FIG. 2 depicts important stages in a general process flow for a method of removing unwanted film from the edge region(s) of a substrate in accordance with the present invention. The method involves providing a semiconductor device substrate having film deposited on the active circuit region and one or more edge regions (i.e., the front, side and/or back edge regions) of the substrate to a chamber (202). The chamber may be any suitable chamber, including a post-deposition module or other post-processing module, a load lock or other transfer chamber. Activated etchant species are generated in a remote plasma chamber (204). The activated species include species capable of reacting with and removing the deposited film, including ions and radical species. In a specific example, the activated species generated in operation 204 include atomic oxygen. The activated etchant species are then selectively directed to the edge of the substrate (206) and the unwanted film is removed by contacting it with the activated species (208).

As indicated, the activated species are selectively directed to the edge areas of the substrate to remove the unwanted film deposited thereon. In some embodiments, this involves directing the plasma to the edge region or regions, while suppressing intrusion of the activated species in the area above the active circuit region so that is does not contact the film deposited on the active circuit region. Suppressing intrusion may involve providing an inert or purge gas over the active circuit region and/or using materials that promote recombination of activated species.

In certain embodiments, the apparatuses of the invention have an outer channel or channels to direct the activated species to the outer edge of the substrate. A barrier may be positioned above the substrate to prevent the etchant species from reaching the film deposited on the active circuit region. Angled deflectors may deflect the activated species away from the active circuit region and/or toward the edge region of the wafer. Purge gas may also be flowed across the wafer to suppress intrusion of the etchant species. In some embodiments, the barrier is an overlying showerhead through which the purge gas is directed. The showerhead may be the part of the same component as the deflector or deflectors or a different component. These features are discussed further below with reference to FIGS. 3-5, which show examples of apparatuses that may be used in accordance with the methods of the invention.

Figure 3A:
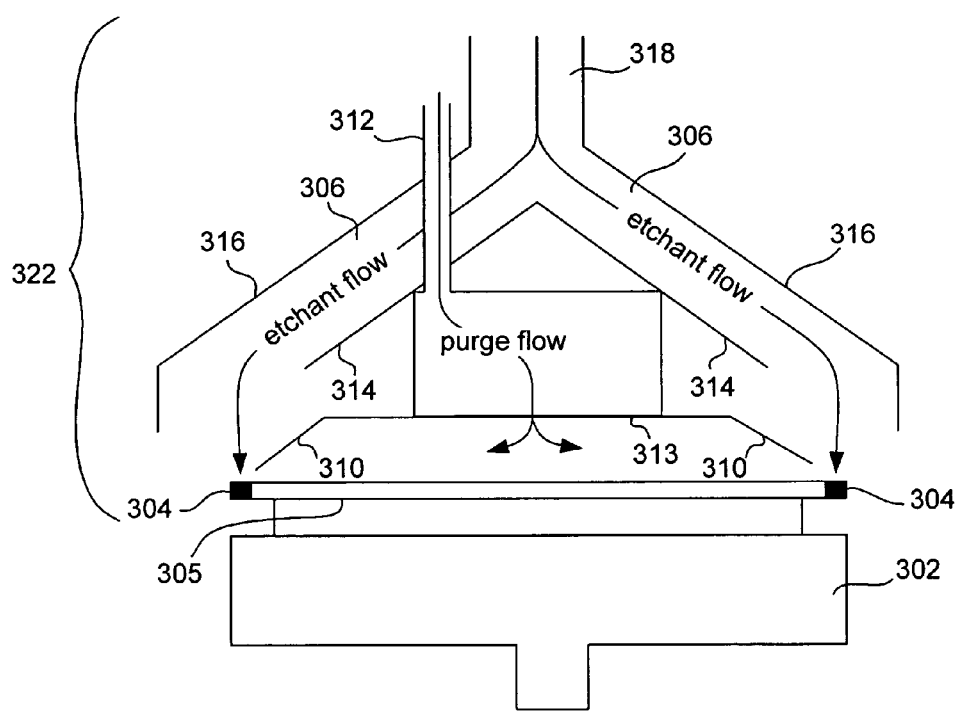
FIG. 3a is a cross-sectional depiction of an apparatus that may be used to remove unwanted film from the edge of a substrate according to certain embodiments of the invention.

FIG. 3a shows a schematic of a cross-section of an apparatus that may be used to remove unwanted film from the edge regions of a wafer or other substrate. The apparatus includes a substrate support 302 that supports a wafer 305. The wafer rests on the support and has edge regions 304. The area interior of the edge regions 304 is the active circuit region. A showerhead apparatus 322 is located above the substrate support 302 for distributing etchant species and inert gas. The showerhead apparatus includes a circular outer channel 306, which is used to direct the etchant species from an inlet 318 (leading from the remote plasma chamber) to the outer edge of the substrate so that the etchant species contacts the edge area 304. An inert or purge gas is directed over the active circuit region, through a channel 312 and a hole (not shown) in a barrier 313. Barrier 313 includes angled deflector 310.

Figure 3B:
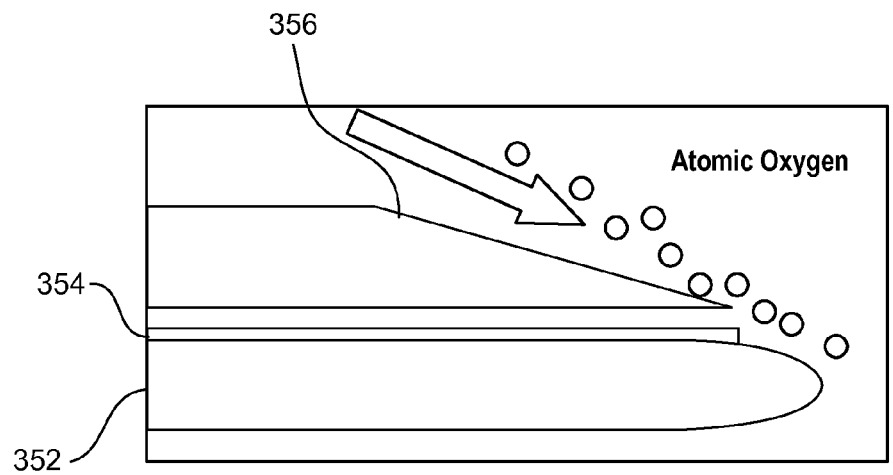
FIG. 3b is a simple schematic illustrating deflection of etchant species away from the center of a wafer having film deposited thereon, and toward the edge of the wafer.

In operation, etchant species are generated in a remote vacuum chamber are directed to the inlet 318. The etchant flow is then channeled through the outer channel 306 to contact edge region 304. The flow is blocked from the active circuit region by barrier 313 and deflected by the deflector 310. A schematic illustrating deflection is shown in FIG. 3b. In FIG. 3b, a wafer 352 with deposited film 354 underlies angled deflector 356. Etchant species, in this example atomic oxygen, flow down from the top of the apparatus (not shown) to the edge of the wafer. The oxygen atoms are prevented from reaching the center of the wafer by the deflector 356 and are deflected toward the edge of wafer, removing the film deposited there.

In the embodiment depicted in FIG. 3a, the outer channel for directing the etchant flow is defined by outer wall 316 and inner wall 314. In certain embodiments, these walls are coated with or made out of a material that prevents or delays recombination of the etchant species generated in the remote chamber. For example, sapphire, quartz, quartz or sapphire-based materials, or other silicon-based materials, including sputtered silicon may be used to delay the recombination of atomic oxygen. Other surfaces that an etchant species contacts in its path to the may coated or made out of such a material as well. For example, the angled top surface of the deflector and/or the etchant species inlet may be coated. The apparatus is typically configured so that the deflector or barrier distance is variable, as is deflector diameter. In certain embodiments, for example, the deflector-wafer gap is variable, e.g., between about 0.001-0.050 inches. Similarly, the deflector diameter may be varied, e.g., between about 0-5 mm from edge (or other suitable distance from the edge.)

The apparatus depicted in FIG. 3a is an example of a particular configuration. Other configurations of an etchant species channel, purge gas channel, barrier and/or deflector are also within the scope of the invention. For example, the etchant species channel may be one contiguous channel as shown above, or may be made up of multiple channels distributed around the edge of the wafer to direct the etchant species.

Figure 4:
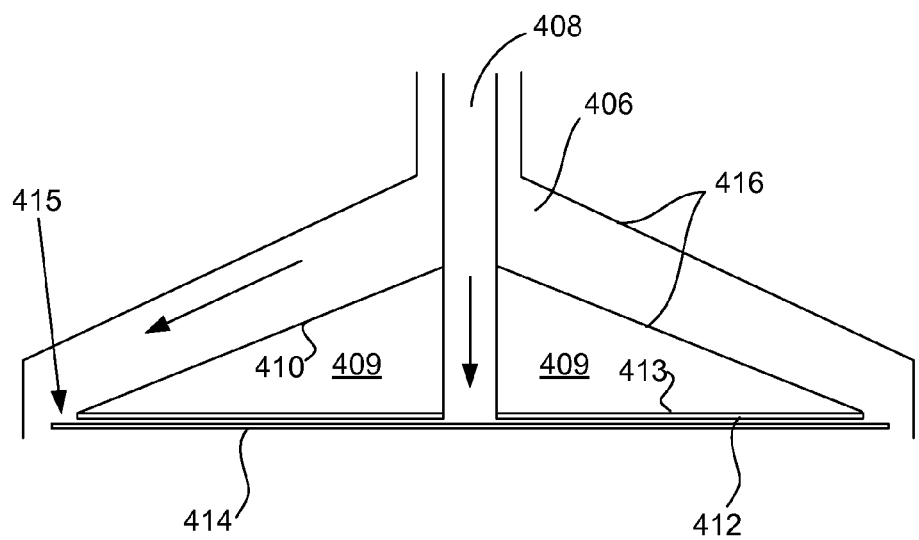
FIG. 4 is a cross-sectional depiction of an apparatus that may be used to remove unwanted film from the edge of a substrate according to certain embodiments of the invention.

A simple schematic of another arrangement is depicted in FIG. 4, having a deflector 410/barrier 413 that overlies wafer 414, etchant species channel 406, and purge gas channel 408. In this embodiment, the deflector 410, the barrier 413 and the inner wall of the etchant channel are provided by the same component 409. The walls 416 defining the etchant channel are quartz or quartz-lined to delay recombination. According to various embodiments, the barrier and the angled deflector may each be part of the same component (as is depicted in FIGS. 3a and 4) or may be separate pieces. In certain embodiments, an angled deflector is not present. The angled deflector in FIG. 4 deflects atomic oxygen to the unwanted film to be removed at area 415 of the wafer.

In many embodiments, the barrier is provided by a showerhead, which also directs purge gas flow across the wafer. In FIGS. 3 and 4, the showerhead has a single opening at or near the center of the substrate so that inert gas flow is directed from the center of the active circuit region out toward the edges of the wafer. Other showerhead arrangements may be employed, including those with multiple apertures. The purge or inert gas flows over the surface of the wafer toward the edge, suppressing intrusion of the activated species to the area above the active circuit region. Purge gas flow rates and distance of the wafer to the showerhead may be adjusted to optimize suppression.

In certain embodiments, the underside of the showerhead (or other component that overlies the active circuit region) is coated with or made from a material that promotes recombination. Stray activated species that intrude into the area above the active circuit region recombine, becoming unreactive and harmless to the film deposited there. Materials including aluminum, iron, nickel, copper surfaces may be used to, for example, promote recombination of atomic oxygen to oxygen gas. Reference number 412 in FIG. 4 indicates material to enhance recombination.

Figure 5A:
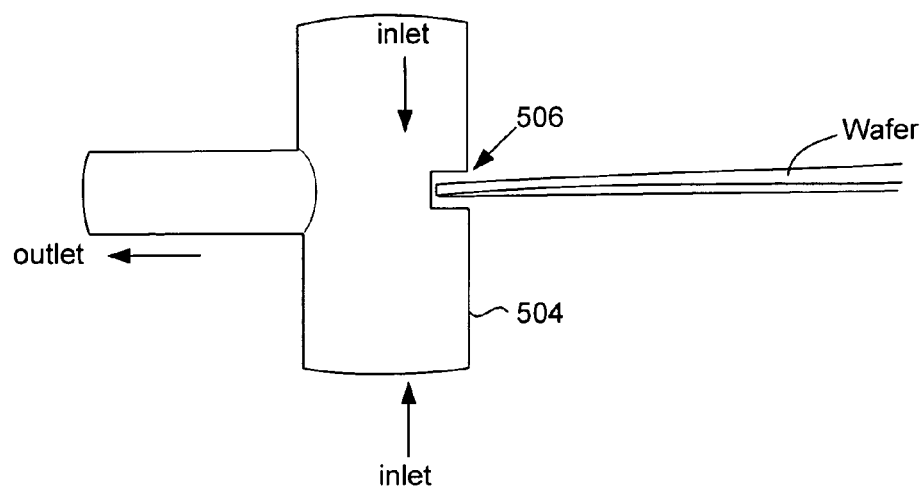
FIG. 5a is simple schematic illustrating a plasma tube and wafer assembly according to certain embodiments of the invention.

FIG. 5a depicts another apparatus that may be used in accordance with the methods of the invention. In the apparatus depicted in the figure, etchant species are generated in a remote plasma generator (not pictured) and enter at inlets of a tube 504. Tube 504 may be the exit tube of the remote generator. The excited species exit the chamber via a slit 506 in the chamber. The edge of the wafer is placed in close proximity to the exit point such that the plasma selectively contacts that region of the wafer. The unwanted film is removed via a plasma etch, with the wafer rotated to clear the entire edge of film. Reaction gases and plasma species exit via an outlet. The inside of the tube and/or the portion of the tube that defines the slit 506 may be coated with or made of a material that delays or prevents recombination (e.g., quartz). The chamber may be coated with or made of a material the promotes recombination.

Figure 5B:
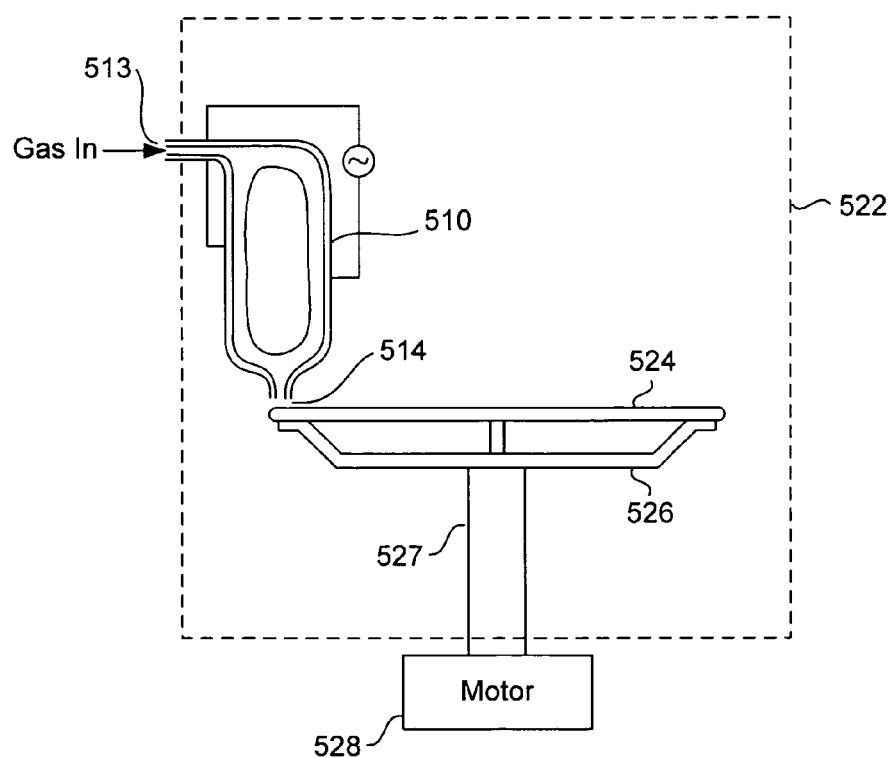
FIGS. 5b and 5c are illustrations depicting plasma chamber and wafer assemblies according to certain embodiments of the invention.

Another example of an assembly remove film from the edge of a wafer is shown in FIG. 5b. Plasma chamber 510 and wafer 524 are housed in module 522. Etchant gases enter the plasma chamber 510 at inlet 513. A discharge is created in plasma chamber 510 to create the plasma; the plasma may be generated by any known method. DC, capacitive or inductive RF and microwave-generated are examples of plasmas in the scope of the invention. Alternatively, the etchant species may be generated in a remote chamber as discussed above with respect to FIG. 5a. The excited species of the plasma exit the chamber at nozzle 514 to selectively contact the edge of the wafer 524. Wafer 524 resides on a wafer chuck 526 that imparts rotational motion to wafer 524. A motor 528 controls the rotation of chuck 526. Motor 528 should be easy to control and should smoothly transition between various rotational speeds if multiple speeds are used. It may reside within or outside chamber 522. In some embodiments, motor 528 resides outside of chamber 522 and is separated therefrom by a seal through which a rotating shaft 527 passes. Any wobble in the shaft on rotation should be small (~<0.05 millimeters for example) so that the location of the plasma chamber nozzle with respect to the wafer does not vary substantially, nor shake the wafer from its center while it is not confined by alignment or clamping members. Preferably, motor 528 can rapidly accelerate and decelerate (in a controlled fashion) chuck 526 and wafer 524 at rotation rates between 0 and about 2000 rpm. The motor speed and other operations should be controllable by a computer.

Chuck 526 may be of any suitable design that holds wafer 524 in position during various rotational speeds. It may also facilitate alignment of wafer 524 for the etching process. Examples of wafer chucks are described in above-referenced U.S. Pat. No. 6,537,416.

Module or chamber 522 may be of any suitable design that confines the plasma. The chamber may be used for other applications, for example, deposition of the film. In certain embodiments, module 522 may be a vacuum chamber of a deposition tool, for example, a transfer module, loadlock, or a separate module docked to the deposition tool. In certain embodiments, the interior of the chamber may be made of or coated with a material (e.g., aluminum) that promotes recombination of the activated species.

In the examples shown in FIGS. 5a and 5b, etchant gases exit at a slit in the a tube to selectively contact the front edge and side edge regions of the wafer. In certain embodiments, the plasma gases may diffuse around the edge of the wafer to contact and etch film from the back edge as well. In other embodiments, two plasma chambers (or tubes) may be used—one located below the wafer, with a nozzle directed at the backside so that etchant gases selectively contact and etch film from the backside of the wafer and one located above the wafer with a nozzle directed at the front side. The lower plasma chamber, or tube connected to the plasma chamber, may be located so that the plasma etches unwanted film from the entire backside, or any region thereof, such as the back edge.

Figure 5C:
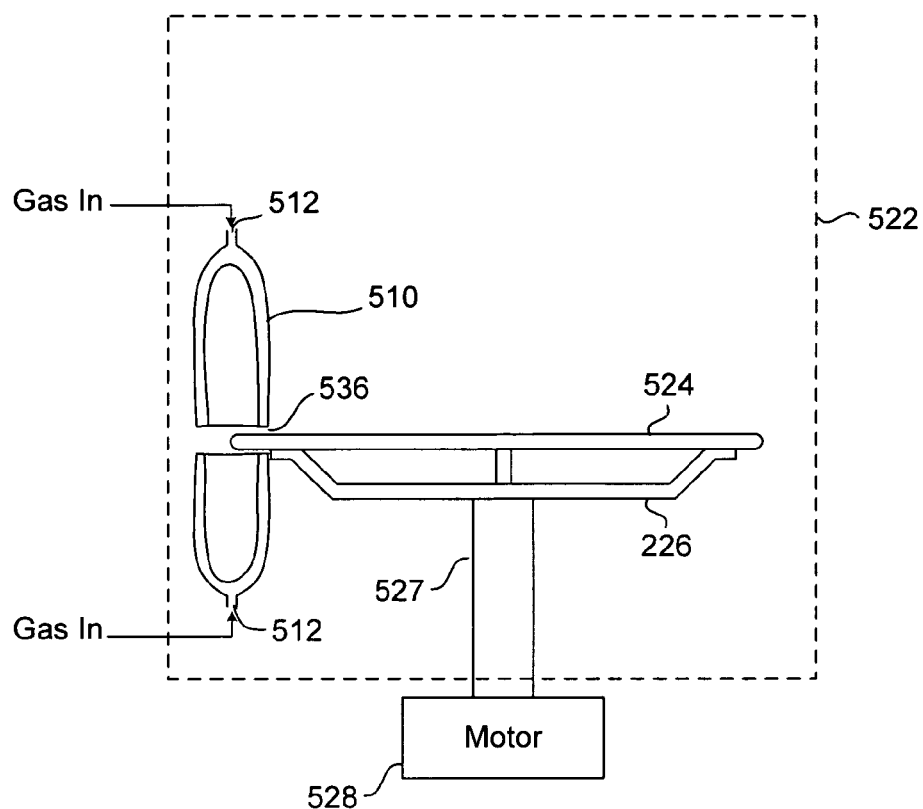

Another example of suitable assembly is shown in FIG. 5c. In this example, gases enter at inlets 512 and the plasma is generated in plasma chamber 510. Excited etchant gases exit the chamber through a slit 536 in the chamber to selectively contact the edge of the wafer. In this manner, unwanted film is etched from the front side and backside of the wafer. The rotatable chuck is as described above. FIG. 5c shows the slit going through the whole cross-section of chamber 510; alternatively only a segment of the chamber may be slit or notched to let gases contact the wafer.

Figure 6:
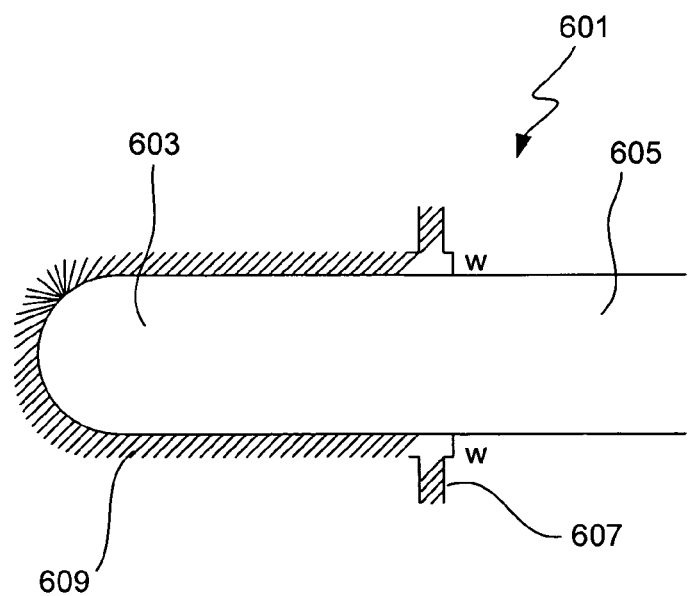
FIG. 6 is an illustration depicting a location of a plasma chamber nozzle and plasma in relation to a wafer etched in accordance with certain embodiments of the invention.

FIG. 6 shows a location of a wafer in relation to the plasma. Selectively contacting the edge regions may involve maintaining the spacing between the wafer and the nozzle or slit edge so that it is less than the width of the plasma dark space. The plasma dark space or sheath is the region that surrounds any surface in contact with the plasma. In FIG. 6, wafer 601 has edge regions 603 (including front edge, side edge and back edge regions described above in FIG. 1) and interior region 605. The spacing w between wafer 601 and nozzles 607 is less than the width of the dark space. Because the spacing between the nozzle and the wafer is less than the width of the dark space, the plasma 609 selectively contacts the edge regions and does not contact the interior region. The width of the dark space depends on plasma conditions, and may range from 1 μm to a few cm in size depending upon the conditions. However, for given plasma conditions, the width should be more or less constant per wafer.

In FIG. 6, the localized plasma contacts and etches unwanted film from the front edge, side edge and back edge regions depicted in FIG. 1. In certain embodiments, depending on the particular application, apparatus and plasma conditions, the plasma may selectively contact and etch film from any subset of these regions. For example, if unwanted film tends only to deposit on the front and side regions, an apparatus may be configured to provide a plasma that selectively contacts these regions.

Particular etch chemistries depend on the deposited film. Examples of etchant chemicals include $O_2$, $H_2$, $N_2$, He, Ar, and fluorine based chemicals including fluorine ($F_2$), hydrogen flouride (HF), fluorocarbons ($C_xH_y$), hydroflourocarbons ($C_xF_yH_z$), $NF_3$ and $SF_6$. For example, fluorine bearing gases may be used to etch silicon-containing films. Metallic films may also be etched by similar fluorine-based chemicals. Organic films may be etched by oxygen or oxygen-containing gases such as $CO_2$, CO, and $N_2O$, hydrogen or hydrogen-containing gases such as forming gas ($N_2/H_2$), as well as other gases including He/N2, He/Ar, $NH_3$, and $H_2O$.

Ashable Hard Masks

In a specific embodiment, edge removal of ashable hard masks is performed. Hard masks are used as etch stop layers in semiconductor processing. Ashable hard masks (AHMs) have a chemical composition that allows them to be removed by a technique referred to as ashing once they have served their purpose. An ashable hard mask is generally composed of carbon & hydrogen with trace amount of one or more dopants (e.g., nitrogen, fluorine, boron, silicon). As indicated, certain embodiments of the invention relate to formation of an ashable hard mask on the active interior region of a wafer or other semiconductor substrate.

Referring back to FIG. 1, during deposition of the hard mask, film may deposit on regions 103, 104, 105 and/or the entire backside 101. For example, in conventional PECVD systems, AHM thickness on the edge regions may be from 50-100% of the center thickness. However, successful integration may require little or no film on these regions. One use of the present invention is to remove unwanted film from one or more of the regions without substantially affecting the AHM deposited on active region 102.

Certain methods of the present invention allow the film to be etched from the backside and edge regions in the reactor in which the deposition is performed. In particular PECVD reactors, such as Sequel™ or Vector™ reactor chambers available from Novellus Systems, Inc., San Jose, Calif. are suitable for the methods of this invention. According to various embodiments, methods of the invention involve depositing an ashable hard mask film on a semiconductor substrate by a PECVD process. After deposition of the film, the substrate is exposed to a plasma to etch unwanted film from the edge regions. As discussed further below, the edge removal may take place in a load lock or in a separate station of PECVD reactor. Alternatively the substrate may be transferred to another tool for edge removal.

In certain embodiments, atomic oxygen in a vacuum chamber is used for edge removal of AHMs, which are composed mainly of carbon and hydrogen, and may contain nitrogen and/or other dopants. The process of burning off the edge film with atomic oxygen does not generate particles. The gaseous products such as CO, CON, etc., do not affect the desired deposited film and may be purged from the chamber. In certain embodiments, the etchant may consist essentially of atomic oxygen. Other etchant chemistries, such as those described in U.S. patent application Ser. No. 11/479,353, may also be used to remove the AHM.

Figure 7:
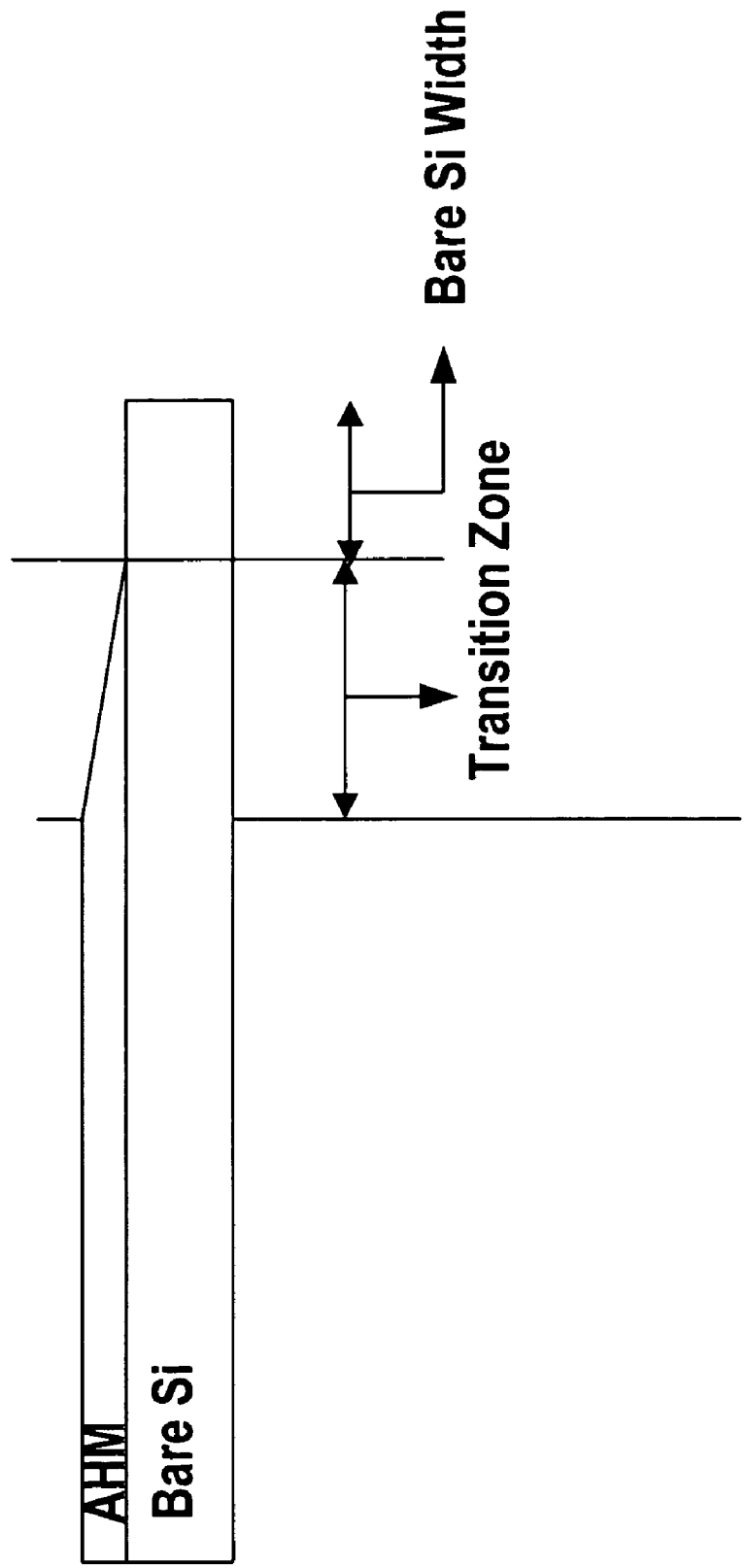
FIG. 7 is an illustration of a portion of a wafer having an ashable hard mask deposited thereon after removal of unwanted film from the edge of the wafer.

FIG. 7 shows a schematic illustrating edge removal of AHM film. As shown in the schematic, film is completely cleared from the back edge, side edge and the front edge to a certain width (labeled "bare Si width"). There is a transition zone in which a reduced amount of film remains. Film that is interior to the transition zone is substantially as deposited.

The bare Si width and transition zone widths may be controlled by the shape and size of the barrier and/or deflector that mask the active circuit region from the etchant plasma, as well as by distance of the substrate to the showerhead or other barrier and the purge gas flow rate.

In one example, the side region (also referred to as the bevel) is bare is 0.8 mm of the front edge. The film is unaffected at distance of 2 mm from the edge, resulting in an allowable transition region of 1.2 mm.

Process Parameters

Purge Gas: Any suitable inert gas may be used, e.g., argon or nitrogen. Although flow rates depend on the particular apparatus used, exemplary flow rates are between 100-5000 scmm.

Etchant Gas: In the case of atomic oxygen, $O_2$ flow may be controlled into the remote plasma generator. In many embodiments, $N_2$ is added to the gas to aid in etchant. For example, a flow may be about 10% $N_2$. The actual amount of atomic oxygen (or other etchant species) that reaches the wafer depends on the efficiency of the remote plasma generator as well as the amount of recombination as it travels to the wafer edge. In certain embodiments involving etching the AHM as described above, examples of typical $O_2$ flow range from 1-5 lpm. Efficiency of the remote plasma generator at generating atomic $O_2$ is typically around 90%.

Deflector Gap: The gap between the wafer and the deflector may be varied to control exclusion. In an apparatus such as that depicted in FIG. 3a, the gap may be varied, for example, from 0.005-0.030 inches.

Deflector Diameter: Deflector diameter may also be varied to change the amount of the wafer exposed according to process needs. For example, the diameter may be varied from 297-299 mm.

Pressure: Pressure typically ranges from 0.5-4 Torr.

Process Time: Typically ranges from 0.5-12 seconds, e.g., 2 seconds.

Apparatus

The invention may be implemented on a multi-station or single station tool. In specific embodiments, the 300 mm Novellus Vector™ tool having a 4-station deposition scheme or the 200 mm Sequel™ tool having a 6-station deposition scheme are used. It is possible to index the wafers after every deposition and/or post-deposition plasma etch treatment until all the required depositions and treatments are completed, or multiple depositions and etches can be conducted at a single station before indexing the wafer. Alternatively, deposition may be conducted at all stations, with etch conducted at, for example, the final station. Also, as indicated, the apparatuses are incorporated into a load lock or post process module, thus increasing versatility of the tool without significant cost increase. For example, a chamber as depicted in FIG. 3a may be incorporated into the outgoing load lock of a plasma enhanced chemical vapor deposition (PECVD) reactor in which the AHM is deposited.

EXAMPLES

The following examples are provided to further illustrate aspects and advantages of the present invention. These examples are provided to exemplify and more clearly illustrate aspects of the present invention and are in no way intended to be limiting.

AHMs of 3500 Angstroms were deposited on substrates by PECVD using a Novellus Vector™ tool on 300 mm wafers.

Figure 8:
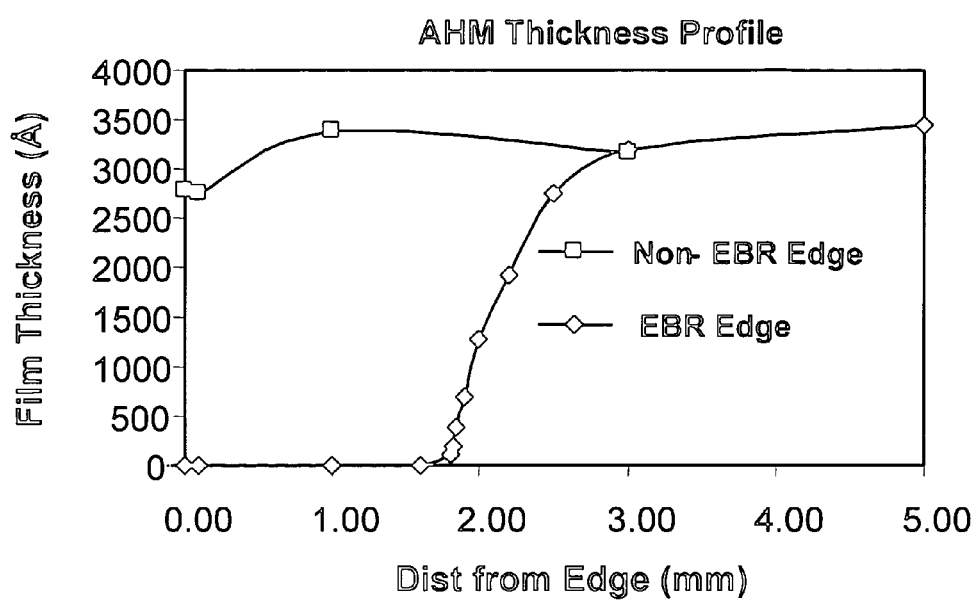
FIG. 8 is a graph comparing ashable hard mask thickness profile for a film having for which unwanted film on the edge was removed with that for a film having unwanted film deposited on the edge region.

Edge removal of the unwanted film was then performed using a chamber similar to that depicted in FIG. 3a located in the load lock of the Vector tool. Process conditions and apparatus parameters were as follows:

Purge Gas: Argon, 750 sccm
Deflector gap: 0.012 inch
Etchant Gas Flow: 3.5 L $O_2$+10% $N_2$
Pressure: 1.5 Torr
Process time: 2 seconds Film was completely removed from the side edge, underside, and front edge of the wafer. FIG. 8 shows a graph comparing AHM thickness profiles of AHMs before and after edge bead removal. As can be seen from the Figure, the edge is completely cleared of film to almost 2.0 mm. Film is unaffected at 3 mm from the edge of the wafer.

Figure 9:
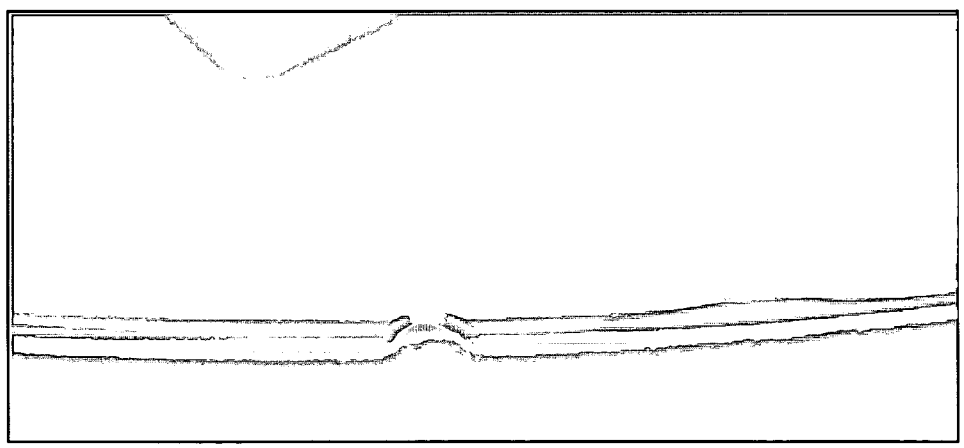
FIG. 9 shows an image of a portion of a wafer and AHM film after undergoing edge removal by a method according to an embodiment of the invention.

FIG. 9 shows an image of a portion of a wafer and AHM film after undergoing edge removal as described above.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

All references cited herein are incorporated by reference for all purposes.

What is claimed is:

1. An apparatus comprising:
   a substrate support, wherein the substrate support includes a support region and wherein the support region includes an interior portion and a peripheral portion;
   a showerhead comprising:
   (i) an inner channel configured to direct a purge gas toward the interior portion of the support region, the inner channel comprising an outlet;
   (ii) an outer channel configured to direct plasma species toward the peripheral portion of the support region, the outer channel comprising an outermost wall and having an outermost diameter;
   (iii) a barrier oriented substantially parallel to the substrate support and coextensive with most of the support region, wherein the barrier has an outermost diameter less than the outermost diameter of the outer channel;
   (iv) a non-barrier region disposed between the barrier and the outermost wall of the outer channel providing an unobstructed flow path from the outer channel towards the support region of the substrate support; and
   (v) a deflector angled with respect to the barrier and substrate support, wherein the deflector is interposed between the non-barrier region and the outlet,
   wherein the inner channel is configured to have no more than a single exit orifice through the barrier for gas flow towards the interior portion of the support region.

2. The apparatus of claim 1, wherein the lower surface of the barrier and/or deflector comprises a material that promotes recombination of the plasma species.

3. The apparatus of claim 2, wherein the material is selected from aluminum, iron, copper and nickel.

4. The apparatus of claim 1, wherein at least some surfaces defining the outer channel comprise a material that delays recombination of the plasma species.

5. The apparatus of claim 4, wherein the material includes silicon.

6. The apparatus of claim 5, wherein the material is quartz.

7. The apparatus of claim 1, wherein the deflector and the barrier are part of a single component.

8. The apparatus of claim 1, wherein the barrier and the deflector are an integrated component.

9. The apparatus of claim 1, further comprising a remote plasma generator.

10. The apparatus of claim 1, wherein the deflector is configured to deflect the plasma species toward the peripheral portion of the support region.

11. The apparatus of claim 1, wherein the diameter of the deflector is variable.

12. The apparatus of claim 1, further comprising a gap between the deflector and the substrate support, and wherein the gap is between about 0.001 inches and 0.050 inches.

13. An apparatus for removing unwanted film from the edge of a substrate with an outermost diameter while leaving film in an interior region of the substrate intact, comprising:
   a substrate support; and
   a showerhead apparatus, comprising:
      (i) an inner channel configured to direct purge gas onto the interior region of the substrate,
      (ii) an outer channel configured to direct plasma species onto the edge of the substrate,
      (iii) a barrier extending over at least some of the substrate support, wherein the barrier comprises no more than a simple opening through which gas passes from the inner channel onto the interior region of the substrate, and
      (iv) an angled deflector, wherein the angled deflector has diameter of no more than about 5 mm less than the outermost diameter,
      wherein the lower surface of the barrier and/or deflector comprises a material that promotes recombination of the plasma species.

14. The apparatus of claim 13 wherein the angled deflector and barrier are different components.

15. An apparatus comprising:
   a substrate support;
   an outer wall;
   a deflector, wherein the deflector comprises a conical frustum and wherein the minor frustum diameter is offset further from the substrate support than the major frustum diameter, and wherein the outer wall and the conical surface of the frustum define a first flow path directing gas flow towards an edge of the substrate;
   a barrier oriented parallel to the substrate support, wherein the barrier includes a barrier surface offset from the substrate support, wherein the offset results in a gap between the barrier surface and the substrate support, wherein the barrier surface is coextensive with most of the substrate support, and wherein the barrier surface and the major frustum diameter are substantially co-planar;
   an inner channel, wherein the barrier, inner channel, and substrate support are configured such that gas flowed through the inner channel flows through the gap between the barrier and the substrate support and towards the deflector major diameter, and wherein the inner channel is configured to have no more than a single exit orifice through the barrier for gas flow towards the substrate support.

16. The apparatus of claim 15 wherein the barrier extends radially from the inner channel to the deflector.

17. An apparatus comprising:
   a substrate support, wherein the substrate support is configured to support a substrate over a support area during film removal operations;
   a showerhead comprising:
      (i) a first gas distribution region, wherein the first gas distribution region is configured to flow a first gas from the showerhead towards the substrate support and wherein the first gas distribution region is substantially centered over the substrate support;
      (ii) a second gas distribution region, wherein the second gas distribution region is configured to flow a second gas from the showerhead towards the substrate support, wherein the second gas distribution region is substantially annular and centered over the substrate support; and
      (iii) a barrier, wherein the barrier is substantially annular and located between the first gas distribution region and the second gas distribution region, wherein the barrier is impermeable to gas flow from the showerhead towards the substrate support, wherein the barrier is offset from, and substantially parallel to, the substrate support, wherein the barrier is further configured to provide a flow path for the first gas which passes through no more than an single orifice in the barrier and which is parallel to the substrate support, and wherein the barrier extends over most of the support area.

* * * * *

UNITED STATES PATENT AND TRADEMARK OFFICE
CERTIFICATE OF CORRECTION

| | | |
|---|---|---|
| PATENT NO. | : 8,100,081 B1 | Page 1 of 1 |
| APPLICATION NO. | : 11/515346 | |
| DATED | : January 24, 2012 | |
| INVENTOR(S) | : Jon Henri et al. | |

It is certified that error appears in the above-identified patent and that said Letters Patent is hereby corrected as shown below:

CLAIMS:

Column 11, line 29 change "than a simple opening through" to --than a single opening through--.

Signed and Sealed this
Fifteenth Day of May, 2012

David J. Kappos
*Director of the United States Patent and Trademark Office*